United States Patent [19]
Ketchpel

[11] 4,255,613
[45] Mar. 10, 1981

[54] ELECTRICAL INTERCONNECT

[75] Inventor: Richard D. Ketchpel, Santa Barbara, Calif.

[73] Assignee: Rockwell International Corporation, El Segundo, Calif.

[21] Appl. No.: 48,942

[22] Filed: Jun. 15, 1979

[51] Int. Cl.³ .................... H01R 9/07; H01R 9/09
[52] U.S. Cl. .................. 174/88 R; 174/117 FF; 174/68.5
[58] Field of Search ........... 174/88 R, 117 F, 117 FF, 174/117 PC, 68.5

[56] References Cited
U.S. PATENT DOCUMENTS

| | | | |
|---|---|---|---|
| 2,854,502 | 9/1958 | Richter | 174/117 PC X |
| 3,443,160 | 5/1969 | Salera | 174/68.5 X |
| 4,000,054 | 12/1976 | Marcantonio | 174/68.5 X |

Primary Examiner—Roy N. Envall, Jr.
Attorney, Agent, or Firm—H. Fredrick Hamann; Craig O. Malin; John J. Deinken

[57] ABSTRACT

Disclosed is a method of connecting a first component, including a first electrical conductor, to a second component, including a second electrical conductor, which involves the steps of positioning the first component proximate to the second component to establish a juncture area, covering the juncture area with an insulating layer to form a smooth surface transition between the first and second components, and depositing a third conductor across the insulating layer and in electrical contact with the first and second conductors.

17 Claims, 6 Drawing Figures

FIG.I.

ELECTRICAL INTERCONNECT

STATEMENT OF GOVERNMENT INTEREST

The invention herein described was made in the course of or under a contract thereunder with the Department of the Army.

BACKGROUND OF THE INVENTION

This invention relates to electrical circuit connections.

Through the techniques of microelectronics, the components of electronic circuits have been considerably reduced in size in recent years. These size reductions have placed corresponding reduction requirements on the techniques which are utilized to interconnect small electronic components, since a useful interconnect must occupy a minimum of space within an electronic device, yet must be adaptable to a mass production technique and remain highly reliable in operation. Thus, a need has developed in the art for an electrical circuit connecting technique which is reliable, compact, and adaptable to use on a very small scale. Additionally, it would be advantageous to provide an interconnect which will permit the subsequent removal and replacement of a single faulty component without the necessity of replacing an entire unit.

SUMMARY OF THE INVENTION

It is a general object of this invention to provide a new and improved interconnect for electronic circuits.

A method of connecting a first component, including a first electrical conductor disposed thereon, and a second component, including a second electrical conductor disposed thereon, according to the invention, includes the steps of:

(a) positioning the first component proximate to the second component to establish a juncture area;

(b) covering the juncture area with an insulating layer to form a smooth surface transition between the first and second components; and (c) depositing a third conductor across the insulating layer and in electrical contact with the first and second conductors.

In a more particular embodiment adapted to connect a first set of conductors on a first component and a second set of conductors on a second component, the method includes the steps of:

(a) overlapping the components;

(b) aligning the first set of conductors with the second set of conductors;

(c) covering the component juncture area with an insulating layer to form a smooth surface transition between the first and second components; and (d) depositing a third set of conductors across the insulating layer and in electrical contact with a corresponding conductor in the first set and in the second set.

The method may include an additional step of covering the third conductor and the component juncture area with a second insulating layer to electrically isolate the interconnection and protect the connection from physical damage.

An electrical connection between a first component, having a first electrical conductor disposed thereon, and a second component, having a second electrical conductor disposed thereon, includes, according to this invention, a juncture area in which the first component is proximate to the second component; an insulating layer covering the component juncture area, thereby forming a smooth surface transition between the first and second components; and a third conductor deposited across the insulating layer and in electrical contact with the first and second conductors.

In a more particular embodiment, the components are overlapped, the conductors are aligned, and the components are adhesively joined in the juncture area.

The first component may further include a first set of electrical conductors and the second component a second set of electrical conductors, the connection then further including a third set of conductors deposited across the insulating layer, each conductor in the third set contacting a corresponding conductor in the first set and in the second set.

Examples of the more important features of the invention have been broadly outlined in this Summary in order to facilitate an understanding of the detailed description that follows and so that the contributions which this invention provides to the art may be better appreciated. There are, of course, additional features of the invention, which will be further described below and which are included within the subject matter of the appended claims.

BRIEF DESCRIPTION OF THE DRAWINGS

Additional objects, features, and advantages of the present invention will become apparent by referring to the detailed description below of the preferred embodiments in connection with the accompanying drawings, wherein like reference numerals refer to like elements throughout all the figures. In the drawings.

DESCRIPTION OF THE PREFERRED EMBODIMENT

Figure 1:
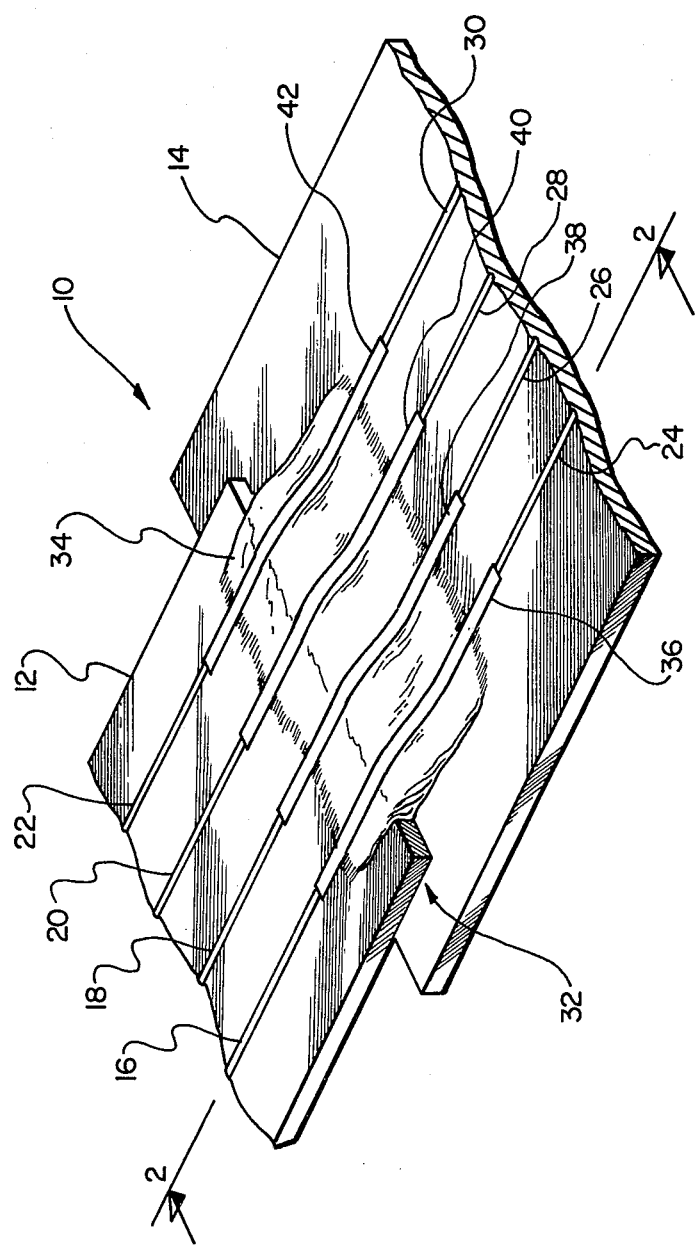
FIG. 1 is a perspective view of an electrical connection constructed according to the present invention.

Now referring to FIG. 1, a perspective view is provided illustrating an electrical connection 10 which is constructed according to the present invention. The connection 10 is completed between a first component 12 and a second component 14. The components may be any appropriate component in an electrical circuit having electrical circuitry which must be connected to another component, such as, for example, the substrate layer of an integrated circuit. Disposed on the upper surfaces of the components 12 and 14 are a first set of electrical conductors 16, 18, 20, 22 and a second set of electrical conductors 24, 26, 28, 30, respectively. Typical of these conductors are the conductors created by techniques such as photolithography in manufacturing printed circuits.

In the juncture area 32, where the conductors are to be connected, the components 12 and 14 are positioned proximate to each other and in overlapping relationship. An epoxy insulating layer 34 covers the juncture area and has spread to a feather edge, so that a smooth surface transition, as shown in FIG. 1, is established between the upper surface of the first component 12 and the upper surface of the second component 14.

Deposited over the epoxy layer 34 is a third set of conductors 36, 38, 40, 42. The third set is positioned so that each conductor in the set contacts a corresponding conductor in the first set and in the second set. Thus, the conductor 36 establishes an electrical connection between the conductors 16 and 24, etc., to complete the necessary electrical connections between the components.

Figure 2:
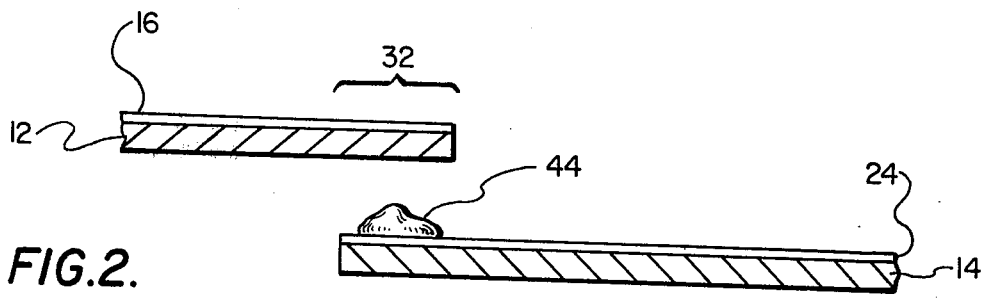
FIGS. 2–5 are side views illustrating the steps involved in assembling the connection illustrated in FIG. 1.
Figure 3:
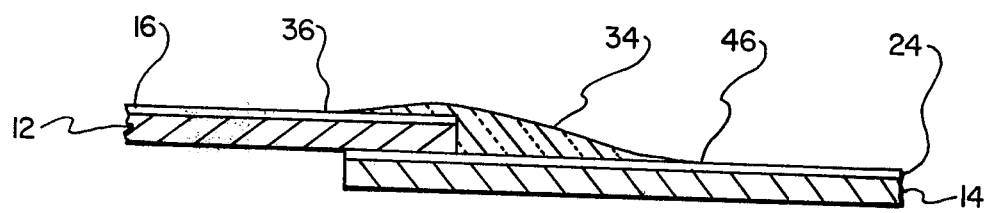

Now referring to FIGS. 2-5, illustrated in a cross-sectional side view along line 2—2 of FIG. 1 are progressive steps in a method, according to this invention, for making the electrical connection 10 shown in FIG. 1. As shown in FIG. 2, the first component 12, including the conductor 16, and the second component 14, including the conductor 24, are positioned in an overlapping relationship and the conductors are aligned. An adhesive 44, such as epoxy, is applied and the components are joined in the juncture area 32.

After the components have been overlapped, aligned, and joined, the juncture area is covered with the insulating layer 34. The material used to establish the layer 34 is selected with particular emphasis on the viscosity of that material. The material must have a viscosity high enough to maintain a smooth transition over the abrupt edge between the components and high enough to avoid excessive spreading over the surface of the components 12 and 14. In addition, the viscosity must be low enough so that the layer 34 extends to a feather edge 46. In this manner, the layer 34 establishes a smooth surface transition between the upper surfaces of the first and second components, making it possible to avoid problems in step edge coverage which might otherwise arise at the abrupt change in surface height between the two components. Step edge coverage can lead to thinning of the conductor deposited over such an edge, resulting in an undesirably high resistance in the conductor. In some applications, an additional consideration may be the coefficient of thermal expansion of the layer 34. Thus, it may be desirable to match that coefficient to the coefficients of expansion for the components 12 and 14, so that heating and cooling of the juncture area will not result in a crack which breaks the electrical connections in that area. Where the coefficients for components 12 and 14 are different, it may also be advantageous to provide a layer 34 with an intermediate coefficient, or with a graduated coefficient of thermal expansion, as may be necessary to alleviate the difficulties experienced in uses involving extreme temperature variations.

Figure 4:
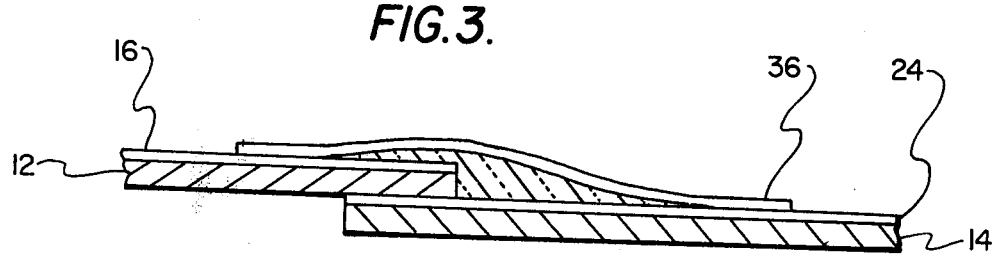
Figure 5:
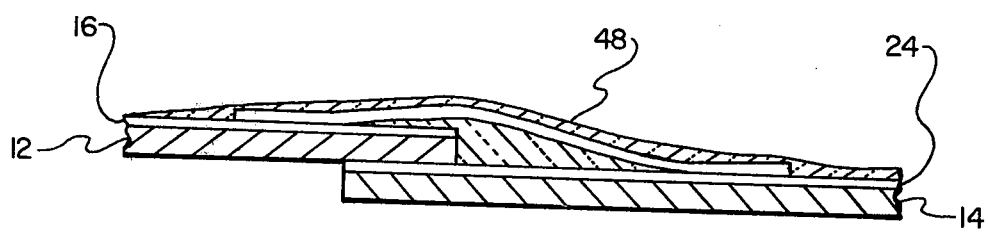

As illustrated in FIG. 4, the next step in forming the connection 10 is to deposit a third set of conductors, including the conductor 36, over the insulating layer 34 so that the third set of conductors establishes contact between the first and second sets. Finally, as illustrated in FIG. 5, an additional insulating layer 48 may be applied, if desired, over the third set of conductors and the layer 34, to provide protection for the completed connection.

The interconnect technique of this invention yields an exposed conductor surface, permitting any open lines to be bridged with wire bonding and permitting any lateral shorts to be opened by laser trimming, prior to the application of a protective insulating layer. Additionally, the technique helps reduce the amount of labor involved in forming interconnects, since any number of connections may be made in one step, such as by depositing the third set of conductors through a mask. The design of the connection also permits the replacement of individual components. Should a particular unit in an assembly fail, for example, the insulating layer over the juncture area for the conductors to that unit can be stripped and the unit removed and replaced with a new component. Finally, the technique is particularly advantageous when it is utilized in microelectronic applications where space is at a premium, since the invention requires one third less area to achieve an interconnect than prior art techniques. Consequently, applications requiring multiple connections may be adapted to the connecting technique of the present invention to provide a higher density of connections than is possible with commonly used techniques in the art. With the formation of thin film evaporated conductors, for example, the present invention may be used to significantly reduce the area which must be set aside in highly integrated microelectronic circuits for the necessary interconnects.

In tests which have been conducted with this technique, connections have been made between a flexible tape conductor, on which there is a copper conductor pattern, and a glass substrate supporting a gold conductor pattern. The conductor patterns were optically aligned, then the tape was attached to the substrate using a thin epoxy layer. A bridging layer of epoxy 1 mm wide was applied to overlap the end of the exposed surface of the tape and the glass substrate, thereby providing a continuous exposed surface between the glass and the tape. The bridging layer was made with Cat-L-Ink Series 50-000 epoxy, a trademark of Warnow, with a number 45 catalyst. In addition, sufficient silicon dioxide was added to the epoxy mixture to establish the correct viscosity for achieving the proper spreading of the layer. Adequate spreading has been achieved by using epoxy, catalyst, and silicon dioxide in the approximate ratios by weight of 125:5.6:1. A metal mask 1 mil thick, containing slots 2 mils wide and 2 mm long on 4 mil centers, was optically aligned over the conductors of the tape and the glass substrate. Gold was then vacuum deposited through the mask to bridge across the epoxy joint. The epoxy flowed to a feather edge during the initial cure, so that the evaporated conductor pattern experienced only minimal problems with step edge coverage. This technique has been utilized to fabricate a large number of connections with minimal defects at the epoxy-thin film joint.

Figure 6:
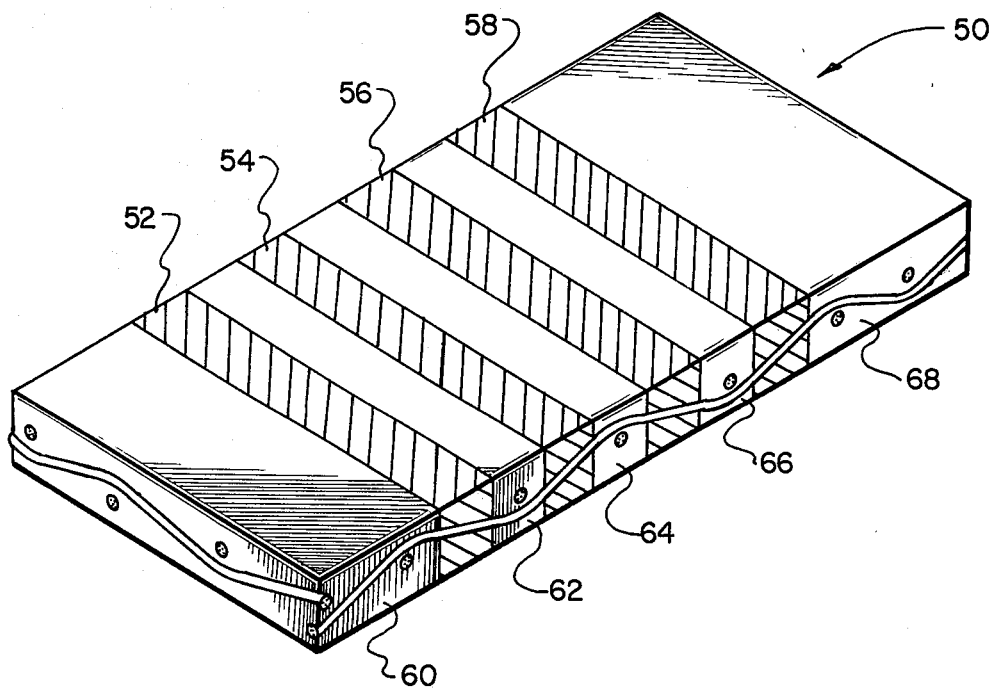
FIG. 6 is a perspective view of a preformed tape which may be used in an alternative embodiment of the connection illustrated in FIG. 1.

In some applications, a modification of the connecting technique of this invention may be desirable. FIG. 6 is a perspective view of a preformed fiberglass reinforced epoxy tape 50 which may be used to provide the insulating layer 34 and the conductors 36, 38, 40, and 42 of FIG. 1. The tape 50 is manufactured in the "B stage", i.e., the hardener is premixed with the epoxy resin in the tape but is not thermally activated. In addition, different epoxies are used so that a series of electrically conducting regions 52, 54, 56, and 58 is interspersed between a series of insulating regions 60, 62, 64, 66, and 68. The tape is laid across a juncture area, aligned, and heated to cure the epoxy. As the epoxy is heated, it flows onto the surfaces of the juncture area to achieve the desired feather edge and a smooth transition between the components to be connected. In addition, the curing process brings the electrically conducting regions into contact with corresponding conductors on the components to accomplish the necessary electrical connections between the components. This embodiment of the invention may be employed in relatively large scale connection applications, as a faster, more efficient, and more reliable alternative to forming electrical connections individually where a large number of connections, such as a row of connections along a side of a component, are to be made.

In conclusion, although typical embodiments of the present invention have been illustrated and discussed herein, numerous modifications and alternative embodiments of the apparatus and method of this invention will be apparent to those skilled in the art in view of this description. Accordingly, this description is to be considered as illustrative only and is provided for the purpose of teaching those skilled in the art the manner of constructing the apparatus and performing the method of this invention. Furthermore, it should be understood that the forms of the invention depicted and described herein are to be considered as the presently preferred embodiments. Various changes may be made in the configurations, sizes, and arrangements of the components of the invention, as will be recognized by those skilled in the art, without departing from the scope of the invention. Equivalent elements, for example, might be substituted for those illustrated and described herein, parts or connections might be reversed or otherwise interchanged, and certain features of the invention might be utilized independently of the use of other features, all as will be apparent to one skilled in the art after receiving the benefit attained through reading the above description of the invention.

What is claimed is:

1. A method of connecting a first component, including a first electrical conductor disposed thereon, and a second component, including a second electrical conductor disposed thereon, comprising the steps of:
   (a) positioning the first component proximate to the second component to establish a juncture area;
   (b) aligning the first conductor with the second conductor in the juncture area;
   (c) adhesively joining the first component to the second component;
   (d) covering the juncture area with an insulating layer to form a smooth surface transition between the first and second components; and
   (e) depositing a third conductor across the insulating layer and in electrical contact with the first and second conductors.

2. The method of claim 1, wherein step (a) further comprises overlapping a portion of the first component with a portion of the second component.

3. The method of claim 1, wherein step (d) comprises covering the component juncture area with an epoxy layer.

4. The method of claim 2, wherein the insulating layer is selected to have a coefficient of thermal expansion matched to the coefficient of thermal expansion of the first component and the coefficient of thermal expansion of the second component.

5. The method of claim 3, further comprising the step (f)
   covering the third conductor and the component juncture area with a second insulating layer.

6. The method of claim 1, wherein step (d) further comprises:
   covering the juncture area with a flexible preformed tape having conducting and insulating regions;
   and wherein step (e) further comprises:
   heating the tape to cause the tape to flow onto and adhere to the juncture area, said conducting region thereby establishing electrical contact between the first and second conductors.

7. The method of claim 1, wherein said first component includes a first set of electrical conductors disposed thereon, said second component includes a second set of electrical conductors disposed thereon, and step (e) further comprises:
   (e) depositing a third set of conductors across the insulating layer, each conductor in the set establishing electrical contact between a corresponding conductor in the first set and in the second set.

8. The method of claim 7, wherein step (d) further comprises:
   covering the juncture area with a flexible preformed tape having conducting and insulating regions;
   and wherein step (e) further comprises:
   heating the tape to cause the tape to flow onto and adhere to the juncture area, the conducting regions thereby establishing electrical contact between corresponding conductors in the first set and in the second set.

9. A method of connecting a first set of electrical conductors disposed on a first component to a second set of electrical conductors disposed on a second component, comprising the steps of: *(a) overlapping the components;*
   (b) aligning the first set of conductors with the second set of conductors;
   (c) adhesively joining the first component to the second component;
   (d) covering the component juncture area with an insulating layer to form a smooth surface transition between the first and second components; and
   (e) depositing a third set of conductors across the insulating layer, each conductor in the third set establishing electrical contact between a corresponding conductor in the first set and in the second set.

10. An electrical connection between a first component, including a first electrical conductor disposed thereon, and a second component, including a second electrical conductor disposed thereon, comprising:
    a juncture area in which the first component is proximate to and aligned with the second component;
    an adhesive joining the first and second components in said juncture area;
    An insulating layer covering said component juncture area, thereby forming a smooth surface transition between the first and second components; and
    a third conductor deposited across said insulating layer and in electrical contact with the first and second conductor.

11. The connection of claim 10, wherein a portion of the first component is in overlapping relationship with a portion of the second component in the juncture area.

12. The connection of claim 11, wherein said insulating layer is selected to have a coefficient of thermal expansion matched to the coefficient of thermal expansion of the first component and the coefficient of thermal expansion of the second component.

13. The connection of claim 10, wherein said insulating layer and said third conductor further comprise a flexible preformed tape having conducting and insulating regions.

14. The connection of claim 12, wherein said insulating layer comprises an epoxy.

15. The connection of claim 14, further comprising a second insulating layer covering the third conductor and the component juncture area.

16. The connection of claim 10, wherein said first component further includes a first set of electrical conductors and said second component includes a second set of electrical conductors, the connection further comprising a third set of conductors deposited across the insulating layer, each conductor in said third set contacting a corresponding conductor in said first set and in said second set.

17. An electrical connection between a first component, including a first set of conductors disposed thereon, and a second component, including a second set of conductors disposed thereon, comprising:
- a juncture area in which the first component overlaps and is aligned with the second component;
- an adhesive joining the first and second components in said juncture area;
- an insulating layer covering said component juncture area, thereby forming a smooth surface transition between the first and second components; and
- a third set of conductors deposited across said insulating layer, each conductor in said set contacting a corresponding conductor in said first set and in said second set.

* * * * *